US006984867B2

(12) United States Patent
Nakajima

(10) Patent No.: US 6,984,867 B2
(45) Date of Patent: Jan. 10, 2006

(54) MAGNETIC MEMORY DEVICE

(75) Inventor: Kentaro Nakajima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 161 days.

(21) Appl. No.: 10/653,976

(22) Filed: Sep. 4, 2003

(65) Prior Publication Data
US 2004/0100832 A1    May 27, 2004

(30) Foreign Application Priority Data
Sep. 5, 2002    (JP) ............................. 2002-260656

(51) Int. Cl.
*H01L 31/0203*    (2006.01)
(52) U.S. Cl. ...................... 257/433; 257/659; 257/666; 257/678; 257/729
(58) Field of Classification Search ................ 257/433, 257/659, 666, 678, 729
See application file for complete search history.

(56) References Cited

U.S. PATENT DOCUMENTS

| 5,939,772 | A | * | 8/1999 | Hurst et al. ................... 257/659 |
| 6,020,625 | A | * | 2/2000 | Qin et al. ..................... 257/666 |
| 6,429,044 | B1 | * | 8/2002 | Tuttle .......................... 438/106 |
| 6,473,336 | B1 | | 10/2002 | Nakajima et al. |
| 6,580,164 | B1 | * | 6/2003 | Ohie ............................ 257/690 |
| 2002/0114726 | A1 | * | 8/2002 | Soga et al. ................... 420/557 |
| 2003/0132494 | A1 | * | 7/2003 | Tuttle et al. .................. 257/433 |

OTHER PUBLICATIONS

R. Scheuerlein et al., IEEE International Solid-State Circuits Conference, ISSCC 2000 / Session 7/ TD: Emerging Memory & Device Technologies / Paper 7.2, pp. 128-129, "TA 7.2 A 10ns Read and Write Non-Volatile Memory Array Using a Magnetic Tunnel Junction and FET Switch in Each Cell", 2000.
M. Sato, et al., IEEE Transactions on Magnetics, vol. 33, No. 5, pp. 3553-3555, "Spin-Valve-Like Properties and Annealing Effect in Ferromagnetic Tunnel Junctions", Sep. 1997.
M. Sato, et al., Jpn. J. Appl. Phys, vol. 36, part 2, No. 2B, pp. L200-L201, "Spin-Valve-Like Properties of Ferromagnetic Tunnel Junctions", Feb. 15, 1997.
K. Inomata, et al., Jpn. J. Appl. Phys, vol. 36, part 2, No. 10B, pp. L 1380-L 1383, "Spin-Dependent Tunneling Between a Soft Ferromagnetic Layer and Hard Magnetic Nanosize Particles", Oct. 15, 1997.

* cited by examiner

*Primary Examiner*—David Nelms
*Assistant Examiner*—Long Tran
(74) *Attorney, Agent, or Firm*—Oblon, Spivak, McClelland, Maier & Neustadt, P.C.

(57)    ABSTRACT

A magnetic memory device having a packaged magnetic memory chip is disclosed, which comprises a package structure including a magnetic memory chip, and a magnetic guide of a high-permeability magnetic material, forming a structural member of the package structure.

14 Claims, 5 Drawing Sheets

MAGNETIC MEMORY DEVICE

CROSS-REFERENCE TO RELATED APPLICATIONS

This application is based upon and claims the benefit of priority from the prior Japanese Patent Application No. 2002-260656, filed Sep. 5, 2002, the entire contents of which are incorporated herein by reference.

BACKGROUND OF THE INVENTION

1. Field of the Invention

The present invention relates to a magnetic memory device.

2. Description of the Related Art

A magnetic random access memory (hereinafter, referred to as MRAM) is a general term indicating a solid-state memory in which the recorded information can be rewritten, stored and read out utilizing the direction of magnetization of a ferromagnetic material as an information recording carrier. The memory cell of the MRAM normally has a stacked structure of a plurality of ferromagnetic layers.

The information is recorded in accordance with whether the relative positions of magnetization of a plurality of ferromagnetic layers constituting the memory cell are parallel or not parallel which correspond to "1" or "0", respectively, in binary information.

The information is written by inverting the direction of magnetization of the ferromagnetic members of the cell by the magnetic field generated by the current supplied to the write lines arranged in cross stripes.

The MRAM basically consumes no power in the storing mode of information, and is a nonvolatile memory in which information can be stored even when the power is switched off.

The information is read out by the use of the phenomenon of what is called the magneto-resistance effect in which the electric resistance of the memory cell changes in accordance with the relative angle between the direction of magnetization of the ferromagnetic layers constituting the cell and the sense current or the relative angles of magnetization between a plurality of ferromagnetic layers.

The functions of the MRAM, as compared with the functions of the conventional semiconductor memory using a dielectric material, have the following advantages:

(1) MRAM is completely nonvolatile and rewritable at least $10^{15}$ times.

(2) Nondestructive read-out operation is possible and no refresh operation is required, thereby allowing the shortening of the read cycles.

(3) As compared with the charge storage-type memory cell, the resistance to radiation is high.

The packing density, the write time and the read-out time per unit area of MRAM are estimated to be generally the same as those for DRAM. Taking advantage of the great feature of nonvolatility, therefore, applications of MRAM are expected as an external storing device for portable equipment, a memory-mixed-LSI and a main memory of the personal computer.

The MRAM now under study for commercialization includes a device exhibiting the tunnel magneto-resistance (hereinafter referred to as TMR) effect as a memory cell (See "ISSCC 2000 Digest Paper TA7.2", for example).

The device exhibiting the TMR effect (hereinafter, referred to as the TRM device) is mainly configured of three layers including a ferromagnetic layer, an insulating layer and a ferromagnetic layer, and the current flows through the insulating layer. The tunnel resistance value changes in proportion to the cosine of the relative angle of magnetization between the two ferromagnetic metal layers and assumes a local maximum value in the case where the two magnetization are not parallel to each other.

In the NiFe/Co/$Al_2O_3$/Co/NiFe tunnel coupling, for example, the magneto-resistance change rate exceeding 25% is found in the low magnetic field of not more than 50 [Oe] (See "IEEE Trans. Mag., 33,3553 (1997)", for example).

Known structures of the TMR device include what is called a spin valve structure in which a counter ferromagnetic member is arranged adjacent to one ferromagnetic member to fix the direction of magnetization to improve the magnetic field sensitivity (See "Jpn. J. Appl. Phys., 36, L200 (1997)," for example), and a structure having double tunnel barriers to improve the bias dependency of the magneto-resistance change rate (See "Jpn. J. Appl. Phys. 36, L1380 (1997)," for example).

Several problems have yet to be solved, however, to develop a MRAM having a packing density of not less than the order of Gigabits (Gb).

One of the problems is the reduction in the write current. In the conventional MRAM proposed, a current is supplied to the wiring and the magnetic field generated thereby is used to invert the magnetization of the recording layer of MTJ (magnetic tunneling junction). The strength of the magnetic field generated from the wiring changes with the current value of the wiring and the distance between the wiring and MTJ. In the past reported cases, however, the strength of the magnetic field generated is about several [Oe/mA].

Further, the threshold value of magnetization inversion of the recording layer of the TMR device (hereinafter, defined as the switching magnetic field Hsw) increases in inverse proportion to the size of the direction of the hard axis of magnetization of the TMR device (hereinafter, referred to as the cell width W) as shown by the equation below.

$$Hsw = HswO + A/W$$

The value A known in the prior art is 10 to 20 [Oe·$\mu$m].

The electromigration is a limiting factor against the reliability of the wiring. The electromigration is accelerated by the wiring current density. The upper limit of the current density of the Al—Cu wiring and the Cu wiring now in use for LSI fabrication is about 10 [mA/$\mu m^2$] and 100 [mA/$\mu m^2$], respectively.

Consider the fabrication under 0.1 $\mu$m rule required for realizing the packing density of Gb order, for example. Even in the case where the Cu wiring is used, the upper limit of the current value that can be supplied in the wiring is about 1 mA, which generates a magnetic field of about several [Oe]. In other words, in order to obtain the MRAM of Gb order, the switching magnetic field of the TMR device is required to be reduced to several tens to several [Oe].

When using the MRAM with such a reduced switching magnetic field, however, careful attention must be paid to avoid a writing error due to external magnetic fields. In mounting the MRAM on an electronic device, for example, it is necessary to consider the magnetic field leaking from the motor, the iron core of the speaker or the permanent magnet, the magnetic field leaking from the hollow core coil of the CRT or the like and the magnetic field leaking from the magnet clip used for the case open/close portion, etc. Also in other life spaces, the magnetic field leaking from the magnet clip may cause the writing error or destroy the data.

FIGS. 1 and 2 schematically show the lines of magnetic flux leaking from the permanent magnet and the hollow coil. The survey conducted by the present inventors shows that the magnetic field along the moving radius of the magnet at a position 5 mm horizontally away from the center of a cylindrical ferrite magnet (surface magnetic pole 1300 kG) 5 mm in radius and 2 mm in thickness is about 30 [Oe].

Generally, household appliances have many magnetic field sources as described above. In using the magnetic memory for these household appliances, therefore, a shield structure is required which protects the recorded magnetic information against the disturbing magnetic fields originating from the environment.

A magnetic shield structure conventionally proposed is shown in FIG. 3, for example. In this example, a magnetic memory is arranged in a hermetically sealed package magnetically shielded with a high-permeability soft magnetic material such as permalloy (See "U.S. Pat. No. 5,939,772, for example).

A package structure configuring a hermetically sealed space using a magnetic shield material, however, makes a bulky package and is undesirable from the viewpoints of both cost and the packaging technique. Especially, the use of such a package structure for household appliances poses a problem.

BRIEF SUMMARY OF THE INVENTION

According to an aspect of the present invention, there is provided a magnetic memory device having a packaged magnetic memory chip, comprising a package structure including a magnetic memory chip; and a magnetic guide of a high-permeability magnetic material, forming a structural member of the package structure.

DETAILED DESCRIPTION OF THE INVENTION

Figure 1:
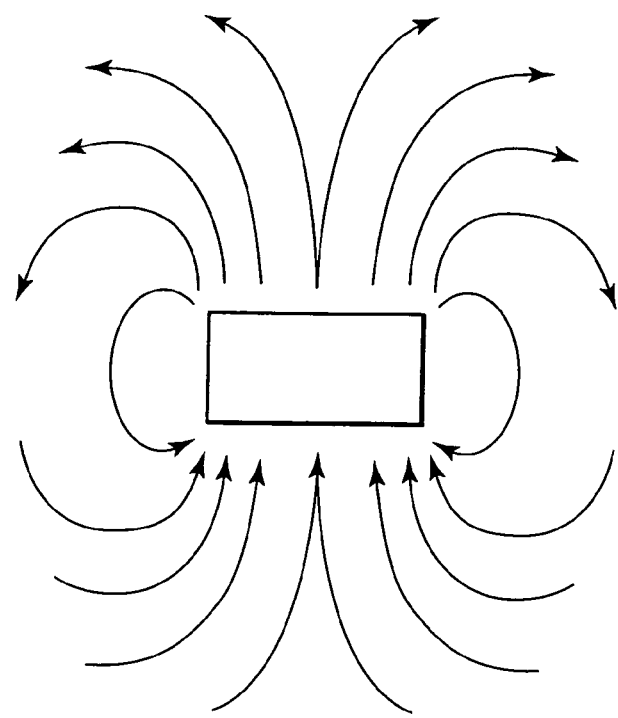
FIG. 1 is a diagram showing the distribution of leakage magnetic flux of a permanent magnet.
Figure 2:
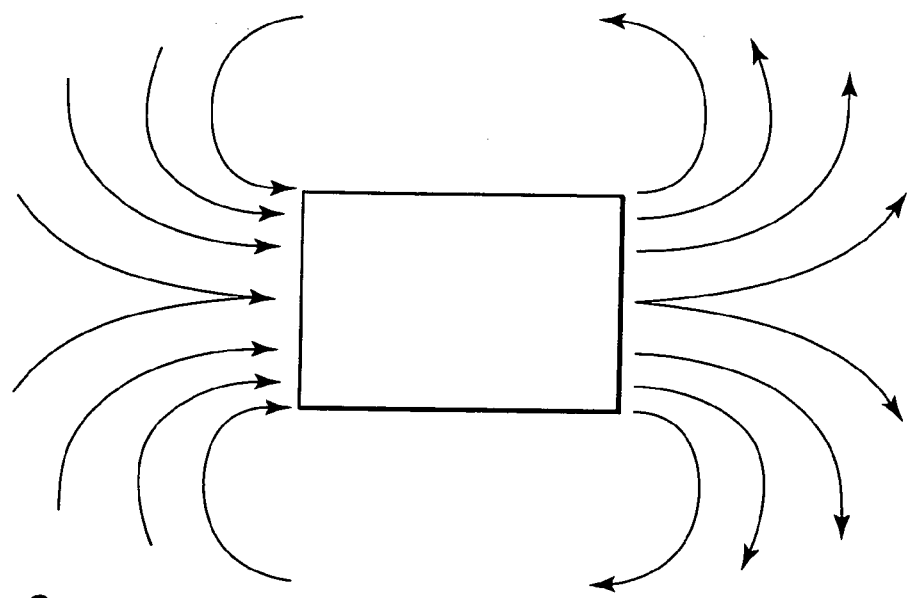
FIG. 2 is a diagram showing the distribution of leakage magnetic flux of a hollow coil.
Figure 3:
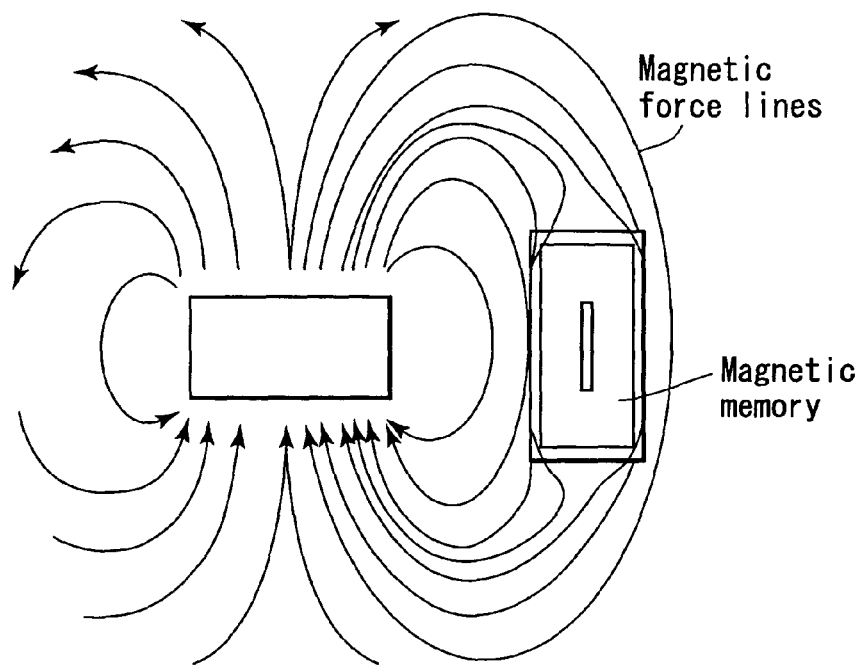
FIG. 3 is a diagram showing a conventional magnetic memory of magnetic shield type.
Figure 4:
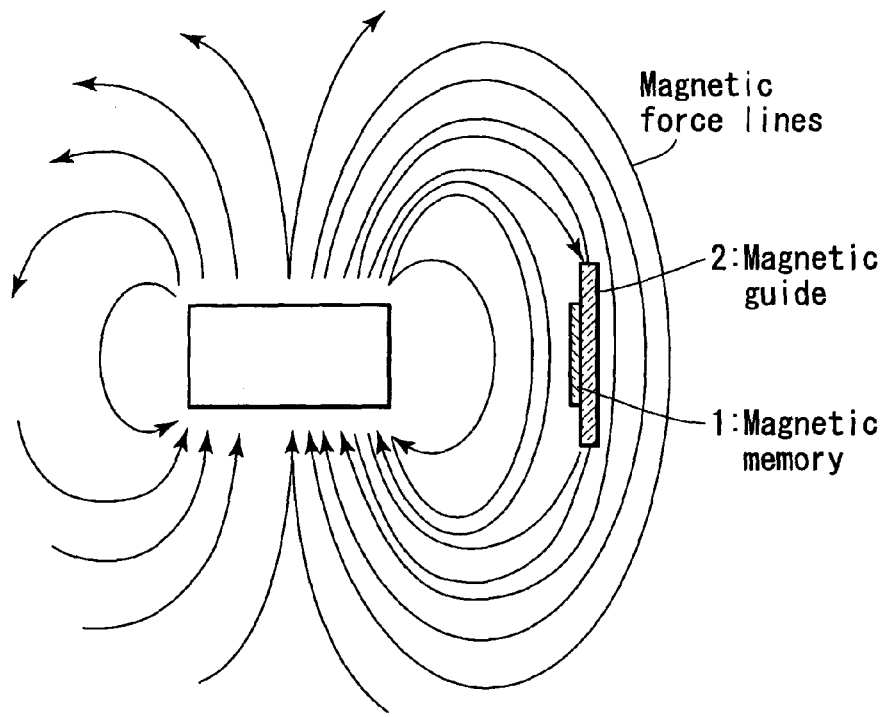
FIG. 4 is a schematic diagram showing a magnetic memory device according to each of embodiments of the present invention, arranged in a magnetic field.

FIG. 4 shows a schematic diagram of a magnetic memory device according to each of embodiments of the present invention, arranged in a magnetic field.

In the magnetic memory packaging shown in FIG. 4, a magnetic guide 2 of a high permeability magnetic material is arranged in contact with or in close proximity to a magnetic memory 1. In this way, the effect of the disturbing magnetic field on the magnetic memory 1 can be reduced by the passing of the magnetic flux leakage in the vicinity of the magnetic memory 1 through the magnetic guide 2 without the introduction of the magnetic flux leakage into the magnetic memory 1.

The requirements to attain the advantage are summarized into the following:

(1) The magnetic guide of a high permeability magnetic material is arranged for the magnetic memory.

(2) The permeability of the magnetic guide is at least ten times larger than that of the storing layer of the magnetic memory.

(3) The magnetic memory is not hermetically sealed by the magnetic guide, but at least one side of the parallelepipedal magnetic guide is open.

By meeting the requirements (1) and (2), the magnetic flux of the disturbing magnetic field are prevented substantially from passing through the storing layer of the magnetic memory. In the case where the requirement (3) is met, the package can be prevented from becoming bulky. Further, it is unnecessary to make measurable changes on the conventional packaging technique and thus a magnetic memory device for household use can be obtained without the increase of the cost.

The optimum distance between the magnetic memory and the magnetic guide, the size, material, permeability, etc. of the magnetic guide are determined in accordance with the specific device structure of the magnetic memory.

Embodiments of the present invention will be specifically explained below.

[First Embodiment]

Figure 5A:
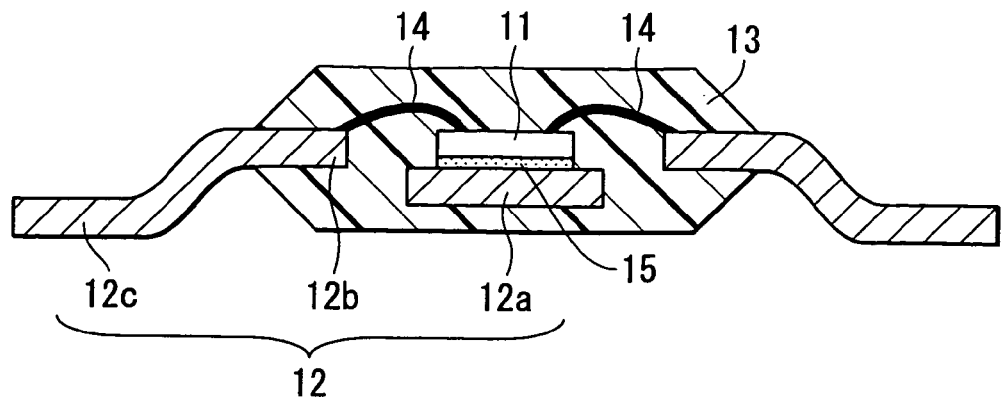
FIG. 5A is a diagram showing a magnetic memory device according to an embodiment of the present invention.

FIG. 5A shows a magnetic memory device according to an embodiment of the present invention. The package structure is that of normal SIP package.

A magnetic memory chip 11 is mounted on a die pad 12a of a lead frame 12 and bonded thereon by a die bonding agent (adhesive). The terminal pad of the magnetic memory chip 11 and the inner leads 12b of the lead frame 12 are connected to each other by bonding wires 14, and then the die pad 12a of the lead frame 12, the magnetic memory chip 11, the inner leads 12b of the lead frame 12, and the bonding wires 14 are molded with a resin 13.

Figure 5B:
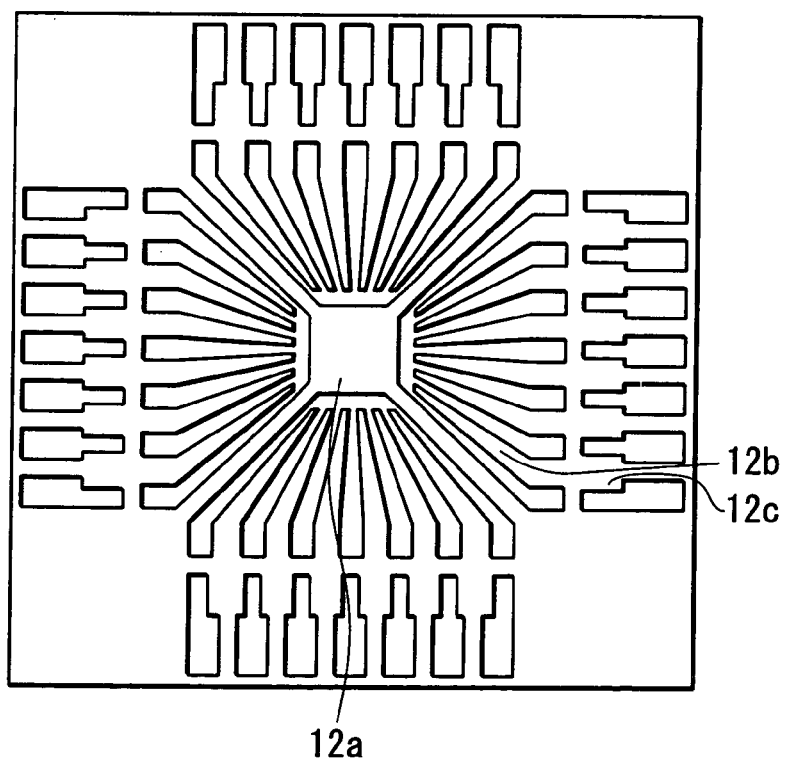
FIG. 5B is a plan view showing a pattern of a lead frame of the magnetic memory device shown in FIG. 5A.

FIG. 5B is a plan view showing a pattern of a lead frame 12 of the magnetic memory device shown in FIG. 5A.

Figure 6:
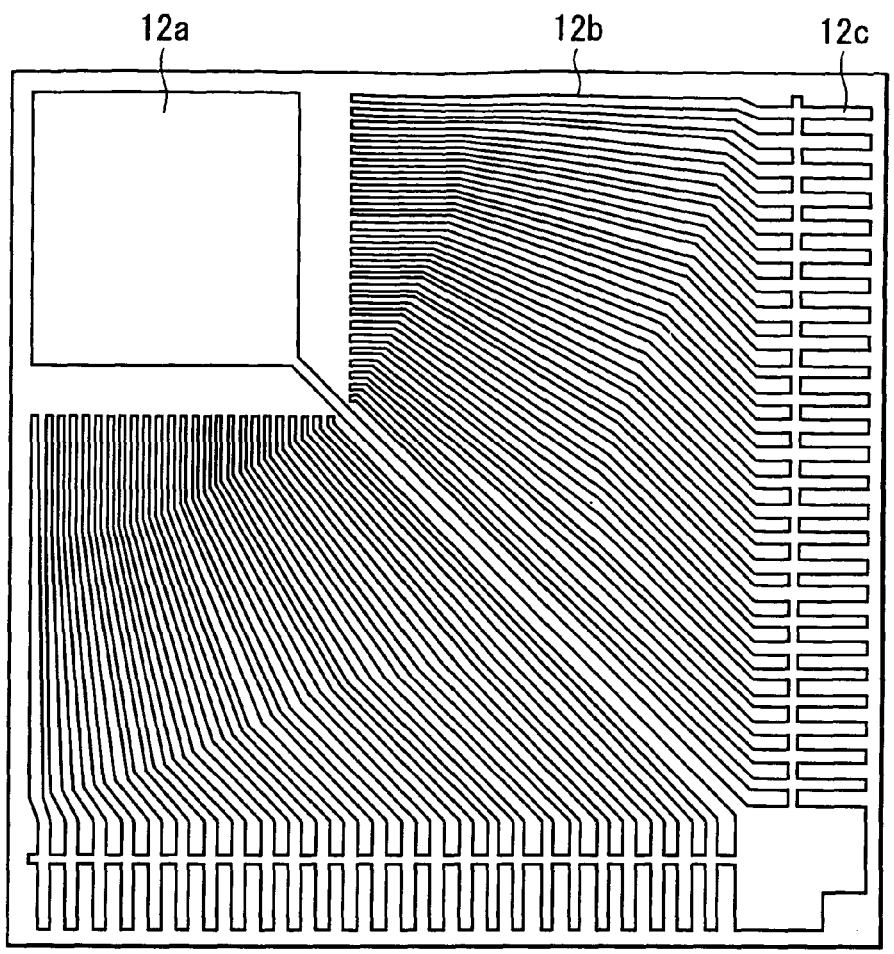
FIG. 6 is a diagram showing another example of the pattern of the lead frame.

The lead frame 12 of the magnetic memory device includes the die pad 12a, the inner frames 12b and the outer frames 12c. In the magnetic memory device of this embodiment, the die pad 12a of the lead frame 12 is located at a center of the package. However, as shown in FIG. 6, a lead frame may be employed in which the die pad 12a of the lead frame 12 is located at a corner of the package. Generally, the material used for this type of lead frame is a Cu material or a Fe material (See Japanese Patent Application KOKAI No. 9-74159, for example).

According to this embodiment, in contrast, the lead frame 12 is configured of a conductive magnetic material of high permeability. As a result, the lead frame 12 constitutes a magnetic guide and the effect of the disturbing magnetic field on the magnetic memory can be suppressed.

In order to reduce the contact resistance of the bonding portions between the magnetic memory chip and the inner lead portions 12a of the lead frame 12, the inner lead portions are plated with a precious metal. On the other hand, in order to improve the solderability for connection of the outer lead portions 12c of the lead frame 12 with connection pads of an external substrate, the outer lead portions are plated with a precious metal or solder.

Preferable magnetic materials of the lead frame 12 include the grain-oriented electrical steel, permalloy, a permalloy alloy with various elements added, a metal crystal material such as sendust and Finemet, a metal amorphous foil, a ferrite material, etc. The shield performance is determined by the permeability of these magnetic materials. In a strong magnetic field, however, the saturation magnetization of the film should also be taken into consideration. Thus, a material may be selected in accordance with the required shield performance.

Let B be the saturation magnetization of the film, $\mu$ the specific permeability of the shield material, and Hmax an expected maximum external magnetic field.

Then, the relation $B<4\pi\mu Hmax$ is the condition required of the shield material. In the case where Hmax is 20 Oe and $\mu$ is $10^3$, for example, B is about 2 T, in which case the grain-oriented electrical steel with Fe as a main component is useful. In the case where Hmax is 50 Oe and $\mu$ is $10^3$, on the other hand, B is about 0.7 T, in which case an alloy of the permalloy group is effective. Hmax is determined taking into consideration only the vector component of the direction of easy axis of magnetization of the storing layer of the memory.

A resin mixed with a high-permeability magnetic particulate may be used as the resin 13. A suitable high-permeability magnetic material includes an oxide such as ferrite of spinel type or ferrite of garnet type. More specifically, a resin with Mn—Zn ferrite and an additive, or a resin with yttrium iron garnet and an additive is used. The addition of these magnetic materials may reduce the insulation characteristic of the resin. Therefore, a normal resin may be used for the portions contacted by the outer lead portion while a high-permeability magnetic material is added only for the other portions.

[Second Embodiment]

The lead frame 12 described with reference to FIGS. 5A, 5B and 6 is a high-permeability magnetic material in its entirety. As an alternative, the surface of the conventional lead frame body of Cu or Fe is covered with a high-permeability magnetic material as a magnetic guide. The high-permeability magnetic film can be formed by plating, vacuum deposition or sputtering. As another alternative, a resin paste containing high-permeability magnetic powder such as ferrite can be coated.

[Third Embodiment]

Figure 7:
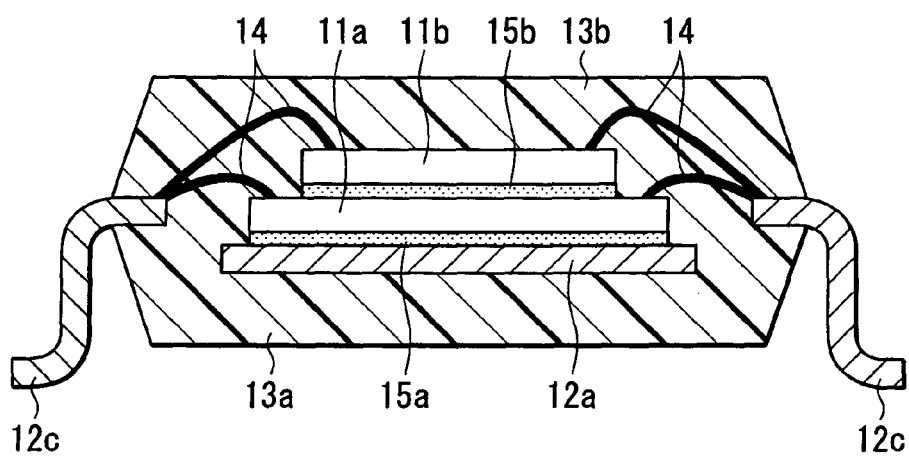
FIG. 7 is a diagram showing a magnetic memory device according to another embodiment of the present invention.

FIG. 7 shows a magnetic memory device according to another embodiment of the present invention, in which the magnetic memory device is of a multi-chip package type.

The magnetic memory chips 11a, 11b are superposed on the die pad 12a of the lead frame 12 and bonded by die bonding agents 15a, 15b. The chips 11a, 11b may not always be both a magnetic memory chip, but the chip 11a may be a logic IC chip, while the chip 11b may be a magnetic memory chip.

Also according to this embodiment, like in the aforementioned embodiments, the lead frame 12 is configured of a high-permeability magnetic material.

As an alternative, a high-permeability magnetic material covered frame may be used, in which the surface of the conventional lead frame body of Cu or Fe is covered with a high-permeability magnetic material as a magnetic guide.

The high-permeability magnetic film can be formed by plating, vacuum deposition or sputtering. As another alternative, a resin paste containing high-permeability magnetic powder such as ferrite can be coated.

[Fourth Embodiment]

Figure 8:
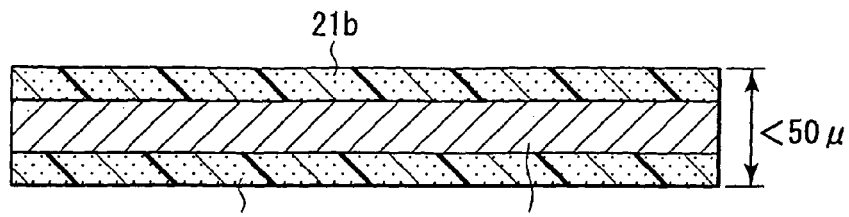
FIG. 8 is a diagram showing a die-bonding sheet.

In the configuration shown in FIG. 7, the lead frame 12 is made of a nonmagnetic metal of high heat radiation characteristic, and at least one of the die bonding agents 15a, 15b for bonding the chip contains a high-permeability magnetic material. As a result, the die bonding agents 15a, 15b act as a magnetic guide. Such die bonding agents may be a resin agent of coating type with particulates of a high-permeability magnetic material mixed in the resin agent. As another alternative, as shown in FIG. 8, a sheet member may be used, which comprises a foil member 22 of high-permeability magnetic material is held between the adhesive resin sheets 21a, 21b.

[Fifth Embodiment]

In the configuration of FIG. 7, the lead frame 12 and the die bonding agents 15a, 15b may be the same as the conventional ones, while the sealing resin 13 may be modified to function as a magnetic guide. In this case, the resin with high-permeability magnetic particulates mixed therein is used for only one of the portion 13b of the resin 13 which covers the upper surface of the chip and the portion 13a of the resin 13 covering the lower surface of the chip. A suitable high-permeability magnetic material includes an oxide such as ferrite of spinel type or ferrite of garnet type. More specifically, a resin with Mn—Zn ferrite and an additive, or a resin with yttrium iron garnet and an additive is used. The addition of these magnetic materials may reduce the insulation characteristic of the resin. Therefore, a normal resin may be used for the portions contacted by the outer lead portion while a high-permeability magnetic material is added only for the other portions.

[Sixth Embodiment]

The third to fifth embodiments described above may be combined. Specifically, in the configuration of FIG. 7, the lead frame 12 is used as a magnetic guide, while the die bonding agents 15a, 15b are also used as a magnetic guide. As an alternative, the lead frame 12 is used as a magnetic guide, while the upper portion 13b or the lower portion 13a of the sealing resin 13 is used as a magnetic guide. As another alternative, the die bonding agents 15a, 15b are used as a magnetic guide, while the upper portion 13b or the lower portion 13a of the sealing resin 13 is used as a magnetic guide. As a further alternative, these members can all be used as a magnetic guide.

[Seventh Embodiment]

Figure 9:
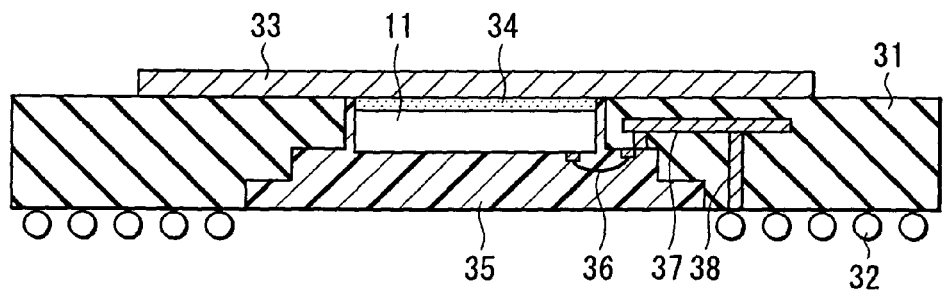
FIG. 9 is a diagram showing a magnetic memory device according to a further embodiment of the present invention.

FIG. 9 shows a magnetic memory device according to a further embodiment of the present invention.

In the package structure in this embodiment of FIG. 9, a ceramic laminate board 31 is fixed on the peripheral portion of a heat sink 33, and a magnetic memory chip 11 is bonded to the central portion of the heat sink 33 by a die bonding agent 34. The outer terminal of the magnetic memory chip 11 is connected by bonding wire 36 to each layer wiring 37 of the ceramic laminate board 31, and the wiring of each layer is connected by a through-wiring 38 to solder balls 32 arranged on one surface of the laminate 31. The magnetic memory chip 11 and its peripheral portion are sealed by resin molding 35.

In this package structure, according to this embodiment, the heat sink 33 is configured of a high-permeability magnetic material and used as a magnetic guide. In the case where a high heat radiation characteristic is required, the body of the heat sink 33 is formed of Cu, Al or the like, and a high-permeability magnetic film is formed on the surface of the heat sink body, as in the second embodiment, as a magnetic guide.

[Eighth Embodiment]

In the package structure shown in FIG. 9, the heat sink 33 is formed of a non-magnetic metal, and the die bonding agent 34 is mixed with a high-permeability magnetic material. As an alternative, a sheet member with a high-permeability magnetic foil member held by resin sheets as shown in FIG. 8 is used as a die bonding agent 34. In this way, by using the die bonding agent 34 as a magnetic guide, the effect of the disturbing magnetic field to the magnetic memory can be suppressed.

[Ninth Embodiment]

In the package structure of FIG. 9, the heat sink 33 and the die bonding agent 34 are the same as the conventional ones. A resin with high-permeability magnetic particulates mixed therein is used as a sealing resin 35 which may function as a magnetic guide. A suitable high-permeability magnetic material is an oxide such as ferrite of spinel type or ferrite of garnet type. More specifically, a resin with Mn—Zn ferrite and an additive or a resin with yttrium iron garnet and an additive is used.

[Tenth Embodiment]

The seventh to ninth embodiments can be combined. Specifically, in the configuration of FIG. 9, the heat sink 33 is used as a magnetic guide, while the die bonding agent 34 is also used as a magnetic guide. As an alternative, the heat sink 33 is used as a magnetic guide, while the sealing resin 35 is also used as a magnetic guide. As another alternative, the die bonding agent 34 is used as a magnetic guide, while the sealing agent 35 is also used as a magnetic guide. Further, all of these members can be used as a magnetic guide.

[11th Embodiment]

Figure 10:
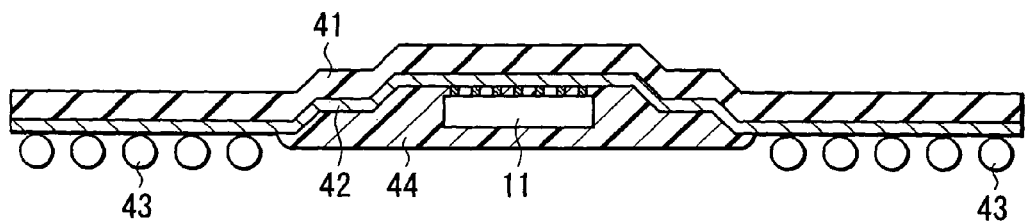
FIG. 10 is a diagram showing a magnetic memory device according to a further embodiment of the present invention.

FIG. 10 shows a magnetic memory device according to a further embodiment of the present invention.

In the package structure in this embodiment of FIG. 10, a wiring 42 for leading a terminal of the magnetic memory chip 11 formed on a surface of a base board 41, and a solder ball 43 is formed on the wiring at the peripheral portion of the wiring 42. A magnetic memory chip 11 is face-down bonded on the surface of the base board 41, and the chip portion is covered with the sealing resin 44.

In this package structure, the base board 41 is made of a high-permeability magnetic material and used as a magnetic guide.

[12th Embodiment]

In the package structure of FIG. 10, the base board 41 may be the same as the conventional ones containing no magnetic materials. A resin with high-permeability magnetic particulates mixed therein is used as a sealing resin 44, which can thus be rendered to function as a magnetic guide. An oxide such as ferrite of spinel type or ferrite of garnet type is suitable as a high-permeability magnetic material. More specifically, a resin with Mn—Zn ferrite and an additive or a resin with yttrium iron garnet and an additive is used.

As an alternative, the base board 41 is made of a high-permeability magnetic material while a resin with high-permeability magnetic particulates dispersed therein is used as a sealing resin 44, and both of them are rendered to function as a magnetic guide.

[13th Embodiment]

Figure 11:
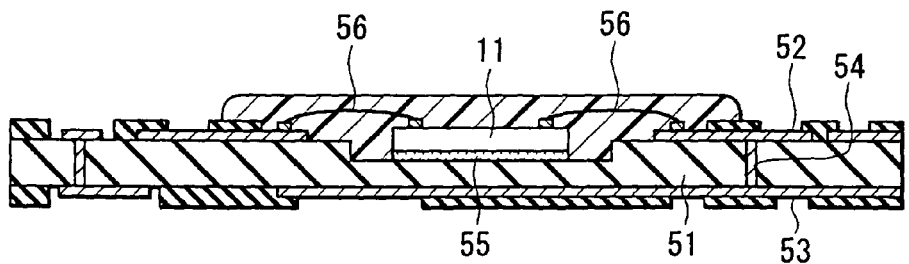
FIG. 11 is a diagram showing a magnetic memory device according to a further embodiment of the present invention.

FIG. 11 shows a magnetic memory device according to a further embodiment of the present invention.

In the package structure in this embodiment of FIG. 11, a base board 51 having a chip mounting portion formed as a depression is a two-side wiring board, and the wirings 52 and 53 on the two sides thereof are connected by way of via-contact layer 54. A magnetic memory chip 11 is bonded on the base board 51 by a die bonding agent 55, and covered with a sealing resin 56.

In this package structure, the die bonding agent 55 is mixed with a high-permeability magnetic material. As an alternative, a sheet member having a high-permeability magnetic foil sandwiched by resin sheets is used as a die bonding agent 55, as shown in FIG. 8. By using the die bonding agent 55 as a magnetic guide in this way, the effects of the disturbing magnetic field on the magnetic memory can be suppressed.

[14th Embodiment]

In the package structure of FIG. 11, a resin with high-permeability magnetic particulates are mixed in the sealing resin 56 is used, which functions as a magnetic guide. As an alternative, both the sealing resin 56 and the die bonding agent 55 can be used as a magnetic guide.

It will thus be understood from the foregoing description that according to the embodiments of the present invention, a magnetic memory device free of the effect of the disturbing magnetic field can be easily provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device having a packaged magnetic memory chip, comprising:

a package structure including a magnetic memory chip; and a magnetic guide of a high-permeability magnetic material, forming a structural member of the package structure, wherein the package structure includes a lead frame on which the magnetic memory chip is bonded by a die bonding agent and a resin which seals the bonded magnetic memory chip, and wherein at least one of the lead frame, the die bonding agent and the sealing resin forms the magnetic guide containing a high-permeability magnetic material, wherein the lead frame is made of a conductive high-permeability magnetic material, wherein the high-permeability magnetic material of the lead frame includes a grain-oriented electrical steel, permalloy, a permalloy alloy with elements added, a metal crystal material, a metal amorphous foil, and a ferrite material, and wherein the metal crystal material includes sendust and Finemet.

2. A magnetic memory device having a packaged magnetic memory chip, comprising:

a package structure including a magnetic memory chip; and a magnetic guide of a high-permeability magnetic material, forming a structural member of the package structure, wherein the package structure includes a lead frame on which the magnetic memory chip is bonded by a die bonding agent and a resin which seals the bonded magnetic memory chip, and wherein at least one of the lead frame, the die bonding agent and the sealing resin forms the magnetic guide containing a high-permeability magnetic material, wherein the lead frame comprises a frame body of Cu or Fe, whose surface is covered with a high-permeability magnetic material film functioning as the magnetic guide, and wherein the high-permeability magnetic material film is formed of a resin paste containing a high-permeability magnetic powder.

3. A magnetic memory device according to claim 2, wherein the high-permeability magnetic powder includes ferrite.

4. A magnetic memory device having a packaged magnetic memory chip, comprising:

a package structure including a magnetic memory chip; and a magnetic guide of a high-permeability magnetic material, forming a structural member of the package structure, wherein the package structure includes a lead frame on which the magnetic memory chip is bonded by a die bonding agent and a resin which seals the bonded magnetic memory chip, and wherein at least one of the lead frame, the die bonding agent and the sealing resin forms the magnetic guide containing a high-permeability magnetic material, wherein the resin is mixed with a high-permeability magnetic particulate, and wherein the high-permeability magnetic particulate includes a resin with Mn—Zn ferrite and an additive, and a resin with yttrium iron garnet and an additive.

5. A magnetic memory device having a packaged magnetic memory chip, comprising:

a package structure including a magnetic memory chip; and a magnetic guide of a high-permeability magnetic material, forming a structural member of the package structure, wherein the package structure includes a lead frame on which the magnetic memory chip is bonded by a die bonding agent and a resin which seals the bonded magnetic memory chip, and wherein at least one of the lead frame, the die bonding agent and the sealing resin forms the magnetic guide containing a high-permeability magnetic material, wherein a plurality of the magnetic memory chips are stacked in a multi-layer form and sealed by a resin, and wherein at least one of the die bonding agents which bond the adjacent magnetic memory chips and the die which bonds agent bonding the lowermost magnetic memory chip and the lead frame contains a high-permeability magnetic powder.

6. A magnetic memory device having a packaged magnetic memory chip, comprising:

a package structure including a magnetic memory chip; and a magnetic guide of a high-permeability magnetic material, forming a structural member of the package structure, wherein the package structure includes a lead frame on which the magnetic memory chip is bonded by a die bonding agent and a resin which seals the bonded magnetic memory chip, and wherein at least one of the lead frame, the die bonding agent and the sealing resin forms the magnetic guide containing a high-permeability magnetic material, wherein a plurality of the magnetic memory chips are stacked in a multi-layer form and sealed by a resin, and wherein at least one of the die bonding agents which bond the adjacent magnetic memory chips and the die bonding agent which bonds the lowermost magnetic memory chip and the lead frame comprises a sheet member having a foil member of a high-permeability magnetic material held between two adhesive resin sheets.

7. A magnetic memory device having a packaged magnetic memory chip, comprising:

a package structure including a magnetic memory chip; and a magnetic guide of a high-permeability magnetic material, forming a structural member of the package structure, wherein the package structure includes a lead frame on which the magnetic memory chip is bonded by a die bonding agent and a resin which seals the bonded magnetic memory chip, and wherein at least one of the lead frame, the die bonding agent and the sealing resin forms the magnetic guide containing a high-permeability magnetic material, wherein a plurality of the magnetic memory chips are stacked in a multi-layer form and sealed by a resin, wherein at least one of an upper portion of the resin which covers an upper surface of the stacked magnetic memory chip and a lower portion of the resin which covers a lower surface of the stacked magnetic memory chip is mixed with a high-permeability magnetic particulate, and wherein the high-permeability magnetic particulate includes a resin with Mn—Zn ferrite and an additive, and a resin with yttrium iron garnet and an additive.

8. A magnetic memory device having a packaged magnetic memory chip, comprising:

a package structure including a magnetic memory chip; and a magnetic guide of a high-permeability magnetic material, forming a structural member of the package structure, wherein the package structure includes a heat sink having a central portion on which the magnetic memory chip is bonded by a die bonding agent, a wiring board bonded on a peripheral portion of the heat sink, to which terminals of the magnetic memory chip are lead-out, and a resin which seals the magnetic memory chip, and wherein at least one of the heat sink, the die bonding agent and the sealing resin forms the magnetic guide containing a high-permeability magnetic material, and wherein the heat sink comprises a heat sink body of Cu or Al, whose surface is covered with a high-permeability magnetic material film functioning as the magnetic guide.

9. A magnetic memory device according to claim 8, wherein the high-permeability magnetic material includes ferrite of spinel type and ferrite of garnet type.

10. A magnetic memory device according to claim 8, wherein the high-permeability magnetic material includes a resin with Mn—Zn ferrite and an additive, and a resin with yttrium iron garnet and an additive.

11. A magnetic memory device having a packaged magnetic memory chip, comprising:

a package structure including a magnetic memory chip; and a magnetic guide of a high-permeability magnetic material, forming a structural member of the package structure, wherein the package structure includes a base board in which leading-out wires are formed and on which the magnetic memory chip is bonded by a die bonding agent, and a resin which seals the magnetic memory chip, and wherein at least one of the base board, the die bonding agent and the sealing resin forms a magnetic guide containing a high-permeability magnetic material, and wherein the base board is made of a high-permeability magnetic material and functions as the magnetic guide.

12. A magnetic memory device having a packaged magnetic memory chip, comprising:

a package structure including a magnetic memory chip; and a magnetic guide of a high-permeability magnetic material, forming a structural member of the package structure, wherein the package structure includes a base board in which leading-out wires are formed and on which the magnetic memory chip is bonded by a die bonding agent, and a resin which seals the magnetic memory chip, and wherein at least one of the base board, the die bonding agent and the sealing resin forms a magnetic guide containing a high-permeability magnetic material, wherein the base board is made of a material containing no magnetic particulates, and the resin is mixed with high-permeability magnetic particulates and functions as the magnetic guide, and wherein the high-permeability magnetic material includes a resin with Mn—Zn ferrite and an additive, and a resin with yttrium iron garnet and an additive.

13. A magnetic memory device having a packaged magnetic memory chip, comprising:

a package structure including a magnetic memory chip; and a magnetic guide of a high-permeability magnetic material, forming a structural member of the package structure, wherein the package structure includes a base board in which leading-out wires are formed and on a chip mounting depression of which the magnetic memory chip is bonded by a die bonding agent, and a resin which seals the magnetic memory chip, and wherein at least one of the base board, the die bonding agent and the sealing resin forms a magnetic guide containing a high-permeability magnetic material, and wherein the base board is made of a high-permeability magnetic material and functions as the magnetic guide.

14. A magnetic memory device having a packaged magnetic memory chip, comprising:

a package structure including a magnetic memory chip; and a magnetic guide of a high-permeability magnetic material, forming a structural member of the package structure, wherein the package structure includes a base board in which leading-out wires are formed and on a chip mounting depression of which the magnetic memory chip is bonded by a die bonding agent, and a resin which seals the magnetic memory chip, and wherein at least one of the base board, the die bonding agent and the sealing resin forms a magnetic guide containing a high-permeability magnetic material, wherein the base board is made of a material containing no magnetic particulates, and the resin is mixed with a high-permeability magnetic material and functions as the magnetic guide, and wherein the high-permeability magnetic material includes a resin with Mn—Zn ferrite and an additive, and a resin with yttrium iron garnet and an additive.

* * * * *